United States Patent
Brady et al.

(10) Patent No.: US 6,380,606 B1
(45) Date of Patent: Apr. 30, 2002

(54) LOCOS ISOLATION PROCESS USING A LAYERED PAD NITRIDE AND DRY FIELD OXIDATION STACK AND SEMICONDUCTOR DEVICE EMPLOYING THE SAME

(75) Inventors: David C. Brady, Austin, TX (US); Isik C. Kizilyalli, Orlando, FL (US); Pradip K. Roy, Orlando, FL (US); Hem M. Vaidya, Orlando, FL (US)

(73) Assignee: Agere Systems Guardian Corp, Orlando, FL (US)

( * ) Notice: Subject to any disclaimer, the term of this patent is extended or adjusted under 35 U.S.C. 154(b) by 0 days.

(21) Appl. No.: 09/205,413

(22) Filed: Dec. 2, 1998

Related U.S. Application Data

(62) Division of application No. 08/878,242, filed on Jun. 18, 1997, now Pat. No. 6,090,686.

(51) Int. Cl.[7] .................. H01L 29/00; H01L 27/102; H01L 29/70
(52) U.S. Cl. .................. 257/506; 257/500; 257/501; 257/504; 257/508; 257/510
(58) Field of Search .................. 257/506, 508, 257/510, 501

(56) References Cited

U.S. PATENT DOCUMENTS

| | | | |
|---|---|---|---|
| 3,874,919 A | 4/1975 | Lehman | 117/212 |
| 3,925,804 A | * 12/1975 | Cricchi et al. | 357/23 |
| 4,110,899 A | 9/1978 | Nagasawa et al. | 29/571 |
| 4,268,321 A | 5/1981 | Meguro | 148/1.5 |
| 4,333,964 A | 6/1982 | Ghezzo | 427/93 |
| 4,398,992 A | 8/1983 | Fang et al. | 156/643 |
| 4,631,804 A | 12/1986 | Roy | 29/576 |
| 4,729,816 A | 3/1988 | Nguyen et al. | 148/33.3 |
| 5,153,701 A | 10/1992 | Roy | 357/54 |
| 5,306,946 A | 4/1994 | Yamamoto | 257/640 |
| 5,441,768 A | 8/1995 | Law et al. | 427/255.7 |
| 5,472,906 A | 12/1995 | Shimizu et al. | 437/72 |
| 5,539,249 A | * 7/1996 | Roman et al. | 257/649 |
| 5,679,600 A | 10/1997 | Juengling | 437/69 |
| 5,763,317 A | * 6/1998 | Lee et al. | 438/448 |
| 5,981,403 A | * 11/1999 | Ma et al. | 438/758 |
| 6,051,496 A | * 4/2000 | Jang | 438/687 |

FOREIGN PATENT DOCUMENTS

| | | | |
|---|---|---|---|
| JP | 61008929 | 1/1986 | 21/318 |
| JP | 6-69499 A | 3/1994 | 29/784 |

OTHER PUBLICATIONS

Seiichi Mori, Yoshiko Yamaguchi Araki, Muneharu Sato, Hisataka Meguro, Hiroaki Tsunoda, Eiji Kamiya, Kuniyoshi Yoshikawa, Norihisa Arai, and Eiji Sakagami, "Thickness Scaling Limitation Factors of Ono Interpoly Dielectric for Nonvolatile Memory Devices," IEEE Transactions on Electron Devices, vol. 43, No. 1, Jan. 1996, pp. 47–53.

(List continued on next page.)

*Primary Examiner*—Eddie Lee
*Assistant Examiner*—Jesse A Fenty

(57) ABSTRACT

The present invention provides methods of manufacturing a field oxide isolation structure over a semiconductor. One of the methods includes the steps of: (1) depositing a first stack-nitride sublayer over the semiconductor at a first deposition rate and (2) subsequently depositing a second stack-nitride sublayer over the first stack-sublayer at a second deposition rate that is either greater or less than the first deposition rate. The first and second deposition rates provide first and second stack-nitride sublayers that cooperate to form a relatively thin, uniform thickness of the field oxide isolation structure over the semiconductor and provide a stress-accommodating system within the semiconductor. The varying rates of deposition and accompanying changes in mixture ratio, produce a stack that is better able to absorb stress, has greater uniformity and is far less subject to the disadvantageous phenomenon of stack-lifting, particularly encountered in semiconductor having a PADOX layer deposited thereon.

23 Claims, 2 Drawing Sheets

OTHER PUBLICATIONS

J. D. Bude, M. Mastrapasqua, M.R. Pinto, R.W. Gregor, P.J. Kelley, R.A. Kohler, C.W. Leung, Ma, R.J. McPartland, P.K. Roy and R. Singh, "Secondary Electron Flash—A High Performance, Low Power Flash Technology for 0.35 µm and Below," 1997 IEEE, pp. 11.3.1—11.3.4.

Seiichi Mori, Eiji Sakagami, Hitoshi Araki, Yukio Kaneko, Kazuhito Narita, Yoichi Ohshima, Norihisa Arai and Kuniyoshi Yoshikawa, "Ono Inter–Poly Dielectric Scaling for Nonvolatile Memory Applications," IEEE Transactions on Electron Devices, vol. 38, No. 2, Feb. 1991, pp. 386–390.

J.R. Pfiester, P.U. Kenkare, R. Subrahmanyan, J.H. Lin and P. Crabtree: "Nitride–Clad Locos Isolation for 0.25µm CMOS"; Digest of Technical Papers of the Symposium on VLSI Technology; May 17, 1993: pp. 139–140.

Q.W. Ren, L.K. Nanver, C. R. de Boer and H.W. van Zeijl; "Silicon Nitride as Dielectric in the Low Temperature SiGe HBT Processing"; Microelectronic Engineering 36 (1997); pp. 179–182.

Peter I.L. Smeys, Peter B. Griffin and Krishna C. Saraswat; "Material Properties or Low Pressure Chemical Vapor Deposited Silicon Nitride for Modeling and Calibrating the Simulation of Advanced Isolation Structures"; Journal of Applied Physics; Aug. 15, 1995; pp. 2837–2842.

H. W. van Zeijl. L. K. Nanver P. J. French; Low–Stress Nitride As Oxidation Ask for Submicrometre Locos Isolation; IEEE Electron Device Letters; May 25, 1995: pp. 927–929.

Gary DePinto and Jim Wilson: "Optimization of LPCVD Silicon Nitride Deposition Process by Use of Designed Experiments"; IEEE Advanced Semiconductor Manufacturing Conference; Sep. 11–12, 1990; pp. 47–53.

Stanley Wolf, "A Review of IC Isolation Technologies–Part 5", Nov. 1992–Solid State Technology, (pp. 47–48).

Stanley Wofd, "A Review of IC Isolation Technologies–Part 6", Dec. 1992–Solid State Technology, (pp. 39–41).

Sang S. Kim, Alan Emani & Simon Deleonibus, "High–pressure and high–temperature furnace oxidation for advanced poly–buffered Locos", Nov. 1994–Solid State Technology, (pp. 67–72).

Koji Suzuki, Kazunobu Mameno, Hideharu Nagasawa, Atsuhiro Nishida, Hideaki Fujiwara Kiyoshi Yoneda, "Half–Micron LOCOS Isolation Using High Energy Ion Implantation", Sep. 1992–IEICE Trans. Electron vol. E75C. No. 9 (pp. 972–977).

H.W. van Zeijl, L. K. Nanver and P. J. French, "Low–stress nitride as oxidation mask for submicrometre LOCOS isolation", May 25, 1995–vol. 31–No. 11–Electronics Letters, (p. 927).

Hong–Hsiang Tsai, Chin–Lin Yu and Ching–Yuan Wu, "A New Twin–Well CMOs Process Using Nitridized–Oxide–LOCOS (NOLOCOS) Isolation Technology", 1989 IEEE, (p. 307).

N. Guillemot, Georges Pananakakis and Pierre Chenevier, A New Analytical Model of the "Bird's Beak", 1987 IEEE, (pp. 1033–1038).

M. Ghezzo, E. Kaminsky, Y. Nissan–Cohen, P. Frank and R. Saia, "LOPOS: Advanced Device Isolation for a 0.8 µm CMOS/Bulk Process Technology", Jul. 1989–vol. 136–No. 7 Journal of the Electrochemical Society, (pp. 1992–1996).

* cited by examiner

LOCOS ISOLATION PROCESS USING A LAYERED PAD NITRIDE AND DRY FIELD OXIDATION STACK AND SEMICONDUCTOR DEVICE EMPLOYING THE SAME

This Application is a Divisional of prior application Ser. No. 08/878,242, filed on Jun. 18, 1997 now U.S. Pat. No. 6,090,686, to David C. Brady, et al. The above-listed Application is commonly assigned with the present invention and is incorporated herein by reference as if reproduced herein in its entirety under Rule 1.53(b).

TECHNICAL FIELD OF THE INVENTION

The present invention is directed, in general, to semiconductor fabrication and, more specifically, to a method of manufacturing a silicon nitride stack and a semiconductor device employing the stack produced by way of the method.

BACKGROUND OF THE INVENTION

Local oxidation of silicon (LOCOS), in which a silicon nitride ($Si_3N_4$) film acts as an oxidation mask and pad oxide is inserted between the nitride and silicon substrate, has been widely used as an isolation technique of very large-scale integrated (VLSI) circuits. As device scaling reaches beyond the sub-half-micron level, one of the key limitations is the device isolation technique. The ideal isolation technique must allow minimum isolation spaces, minimum bird's beak encroachment, minimum defect formation and isolation leakage, process controllability, and cost effectiveness.

LOCOS refers to selective oxidation in device isolation spaces while leaving active device areas unoxidized. The active device area is protected from oxidation by low-pressure chemical vapor deposition (LPCVD) deposited nitride hard masking. Poly buffered LOCOS (PBL) utilizes polysilicon or amorphous silicon ($\alpha$-Si) as a buffer between the pad oxide and masking nitride to prevent stress-induced defects. This application of polysilicon allows thinner pad oxide and thicker nitride.

Conventional LOCOS and its derivatives have been remarkably successful in meeting device isolation requirements for metal oxide semiconductors (MOS) technologies developed and manufactured over the last twenty years. There are several reasons for the longevity of LOCOS-based approaches. First, its use of relatively simple and well-controlled process steps ensures high manufacturability. Second, the evolution of more advanced forms of LOCOS have demonstrated a continual reduction in the lateral field oxide encroachment (bird's beak), thereby resulting in denser circuits. Finally, device isolation has been enhanced by process changes resulting from metal oxide semiconductor field effect transistor (MOSFET) scaling. Shallow junctions and high well doping are good examples of the synergistic requirements between the isolation and MOSFET process modules.

During the formation of the field oxide (FOX), a "bird's-beak" is formed, which partially extends under the nitride layer. Bird's beak encroachment refers to lateral oxidation encroachment due to lateral oxygen diffusion beneath the masking nitride, forming the shape of a bird's beak. The encroachment reduces the effective size of the device active regions, thus limiting further scale down. Bird's beak encroachment is measured from the edge of the masking nitride to the end of oxidation beneath the nitride. As is well known, the bird's-beak produces stress to the nitride layer resulting in nitride lifting and micro-cracks. Therefore, a stress nonuniformity in the nitride layer always exists.

In 0.9 micron size technologies, there were few deleterious effects associated with the formation of the bird's-beak, since the FOX thickness was typically around 700 nm and the pad oxide (PADOX) thickness was typically around 20 nm. Thus, even if all of the nitride layer was not removed during the first etch, additional etching could be safely conducted without substantial FOX loss and reduction in the overall thickness of the FOX. Moreover, there was not great concern for puncturing through the PADOX and into the silicon substrate during the additional etching process since the PADOX was thicker.

However, as the design rules have decreased to sub-0.5 micron sizes, the thicknesses of the FOX and PADOX have also decreased. The FOX thickness has decreased to about 400 nm and below and the PADOX thickness has decreased to about 1.5 nm. As such, LOCOS processes using steam FOX have become less desirable because of the harmful effects of the bird's-beak.

In these sub-0.5 $\mu$m technologies, the extension of the bird's-beak under the nitride layer causes oxide/nitride stack lifting. Stress within the nitride layer generated during nitride deposition coupled with stress acquired from bird's beak encroachment results in uneven stress distribution within the nitride layer, causing the nitride layer to etch unevenly. This uneven etching is highly undesirable because the FOX's thickness is now 400 nm or less, and the large FOX thickness loss during wet etching results in severe compromise on isolation.

Furthermore, the effects of the bird's-beak with respect to the non-uniform etching of the nitride layer is exacerbated by the facts that conventional deposition processes produce a nitride layer that has a thickness variability of 10% or greater, and the PADOX layers in present day semiconductor devices are around 10.0 nm thick versus the 20 nm thickness found in former technologies. Because of this high thickness variability in the nitride layer and the thinness of the PADOX, the PADOX layer may be inadvertently etched through during the removal of the nitride layer. If the PADOX layer is penetrated and the etch proceeds into the substrate, the semiconductor device may be damaged and may have to be discarded. Therefore, it is highly desirable that the nitride layer have minimum stress and thickness variability for uniform nitride removal with minimum FOX loss and PADOX punch through.

To alleviate the problems associated with the conventional LOCOS process (e.g., long bird's beak enchroachment using steam FOX), other isolations schemes, such as the of PBL, have been proposed. The PBL process reduces the bird's-beak encroachment but creates other processing problems. Unfortunately, however, the PBL isolation process inherently poses several process difficulties. Two important limitations of these isolation schemes are bird's beak encroachment and field oxide thinning effect.

Field oxide thinning refers to the oxidation growth rate difference between submicron isolation spacing and limited spacing (>1.0 $\mu$m) in the same wafer. The oxidation growth rate in isolation spaces 21 1.0 $\mu$m may achieve the targeted oxide thickness, while the growth rate in the submicron area is significantly suppressed. The thinning effect is significantly increased as isolation space decreases. This effect poses significant challenges to effective device isolation and smooth surface topology for sub-0.5-$\mu$m technologies. Accordingly, minimization of field oxide thinning is essential.

In addition to the PBL, other isolation processes have been proposed that involve a dry oxide process. Dry oxide processes also reduce the bird's beak, which, in turn, allows LOCOS isolation for sub-0.5 μm design rules. While this process does limit the effects of the bird's-beak, it, unfortunately, has the drawbacks of requiring very high temperatures and requiring long periods of time in which to grow the FOX to the appropriate thickness. Therefore, dry FOX LOCOS isolation scheme should accompany a lowering of FOX thickness and a tighter control of PADOX/nitride properties during CMOS processing.

Still further processes have involved forming a thicker PADOX. When combined with the fact that conventional processes for forming the nitride layer produces a nitride layer having a thickness variability of 5% or greater, this proposed process produces a problem, which only amplifies the above-discussed problems. The problem is that the thicker PADOX simply increases the bird's beak length, which, in turn, increases the amount of stress in the nitride layer. The increased stress within the nitride layer increases the etch variability of the nitride layer, which, in turn, increases the possibility of puncturing the PADOX.

Therefore, what is needed in the art is a process that does not include the disadvantages associated with the isolation schemes of the prior art. The present invention addresses these needs.

SUMMARY OF THE INVENTION

To address the above-discussed deficiencies of the prior art, the present invention provides methods of manufacturing an isolation structure over a substrate such as that typically found in semiconductors. In one advantageous embodiment, the method includes the steps of: (1) depositing a first stack-nitride sublayer over the substrate at a first deposition rate and (2) subsequently depositing a second stack-nitride sublayer over the first stack-sublayer at a second deposition rate that is different from the first deposition rate. The first and second deposition rates provide first and second stack-sublayers that cooperate to form a uniform thickness of the isolation structure over the substrate and provide a stress-accommodating system within the isolation structure. In one embodiment, the first deposition rate preferably ranges from about 0.5 nm per minute to about 1 nm per minute and the second rate of deposition preferably ranges from about 3 nm per minute to about 5 nm per minute.

The present invention therefore introduces a method of manufacturing a relatively uniform isolation structure having multiple nitride sublayers. The varying rates of deposition, and in some embodiments, accompanying changes in mixture ratio, as well as pressure changes produce a nitride stack that is better able to absorb stress, has greater uniformity and is far less subject to the disadvantageous phenomenon of stack lifting, particularly encountered in semiconductor having a PADOX layer deposited thereon.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
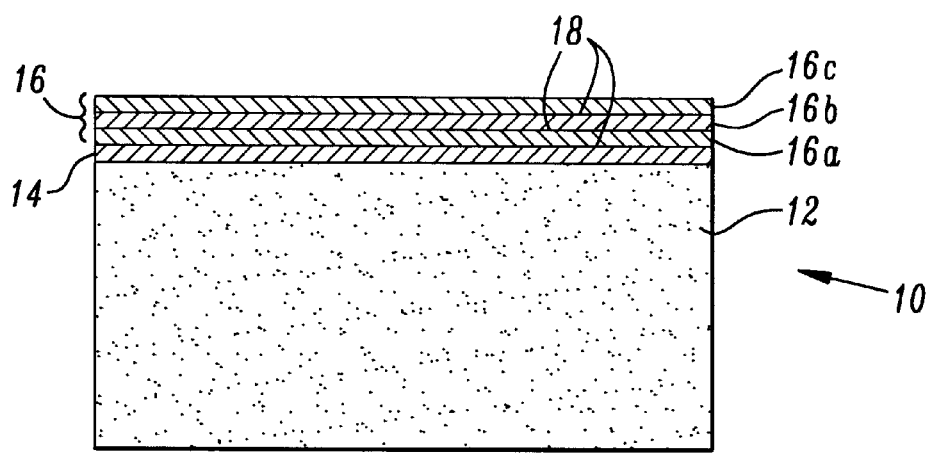
FIG. 1 illustrates a schematic representation of a exemplary structure according to an advantageous embodiment of the present invention, having a nitride layer structure formed over a pad oxide on the surface of a semiconductor substrate.

Referring initially to FIG. 1, there is illustrated a semiconductor wafer 10 manufactured in accordance with an advantageous embodiment of the present. The semiconductor wafer 10 is comprised of a substrate 12, which has been doped in accordance with conventional processes. While it is preferred that the substrate 12 is comprised of silicon, it will be recognized that other materials, whether presently known or later-determined, may also be used for such manufacture in place of the silicon. A pad oxide, PADOX 14, has been formed over the surface of the substrate 12. The PADOX 14 is preferably thermally grown by conventional processes from the substrate 12 itself and is silicon dioxide ($SiO_2$) in exemplary embodiments.

Because of the advantages associated with the present invention, the thickness of the PADOX 14 may range from about 5 nm to about 25 nm. However, in an exemplary embodiment, the thickness is less than about 6.5 nm, which is considerably thinner than pad oxide thickness of prior art processes and devices. As previously explained, the thickness of the PADOX 14 is a factor in determining the isolation integrity (e.g., bird's-beak length and stack lifting), which is a significant factor in minimizing the stress effects of the bird's-beak formed during the field oxide (FOX) formation. If the PADOX 14 is thicker, there is an increase in the bird's-beak length and thus, the stress. Therefore, it is advantageous to reduce the thickness of the PADOX 14. For example, in some prior art processes and devices, the bird's-beak length achieved lengths as much as about 85 nm. Due to the advantages associated with the present invention, however, it is believed that a bird's-beak length of less than 50 nm can be achieved, which will substantially reduce the amount of stress formed within the FOX isolation structure that is formed over the PADOX 14.

The desirable thickness of the PADOX 14 is a function of the thickness variability of the FOX isolation structure and the etch selectivity of that structure and may be mathematically expressed as follows: $2\delta$/etch selectivity<PADOX thickness, where $\delta$ is the thickness variability. Thus, the desired thickness of the PADOX 14 may be determined by simply knowing the thickness variability and the etch selectivity of the FOX isolation structure.

Continuing to refer to FIG. 1, there is illustrated an isolation structure 16 formed over the PADOX 14, which is used to isolate the field oxide during its deformation. The isolation structure 16 may comprise two layers 16a and 16b. However, in an exemplary embodiment, the isolation structure 16 may comprise at least a third layer 16c with the overall thickness of the isolation structure 16 having a thickness that ranges between 3 nm and 120 nm. However, it should be noted that an isolation structure comprised of more than three layers is also within the scope of the present invention. In fact, it is believed that the greater the number of layers, the greater the stress reducing capabilities of the isolation structure 16, as long as the layers do not extend the overall thickness beyond desired parameters.

The isolation structure 16 is attained by a deliberate oscillation in deposition rate, which is discussed in more detail below. It is expected that this oscillatory deposition scheme creates sublayers within the isolation structure 16 that forms virtual interfaces to accommodate stress and hence minimize pinholes, thickness variability and microcrack nucleation and propagation. Each layer is successively formed over the other at a rate different than the one before it.

In one embodiment, the first isolation stack-sublayer 16a is deposited at a first deposition rate, for example 1 nm per minute, and the second isolation stack-sublayer 16b is then deposited over the first stack-sublayer 16a at a second deposition rate that is different from the first deposition rate, for example 2 nm per minute. In those embodiments where the third isolation stack sub-layer 16c is present, its deposition rate is preferably equal to the deposition rate of the first isolation stack-sublayer 16a. This provides a deposition rate scheme that could be a low rate-high rate-low rate or high rate-low rate-high rate, however, the low-high-low rate scheme is preferred, and it should be recognized that other oscillating schemes are possible and within the scope of the present invention.

In either scheme, however, the first and second deposition rates provide first and second isolation stack-sublayers 16a, 16b that cooperate to form a uniform thickness of the isolation structure 16 over the PADOX 14 and provide a stress-accommodating system within the isolation structure 16. It is believed that this oscillatory deposition rate scheme produces virtual interfaces 18 between the layers 16a, 16b and 16c. As stated above, it is believed that it is these virtual interfaces 18 that form the stress-accommodating system within the isolation structure 16.

The present invention therefore introduces a method of manufacturing a relatively thin field oxide isolation structure having multiple sublayers. The varying rates of deposition, and in some embodiments, accompanying changes in mixture ratio, is believed to produce a structure that is better able to absorb stress, has greater uniformity and is less subject to the disadvantageous phenomenon of stack lifting, particularly encountered in semiconductor having a PADOX layer deposited thereon.

In an advantageous embodiment, the isolation structure 16 is comprised of a silicon nitride that is composed of a mixture of ammonia ($NH_3$) and dichlorosilane $SiCl_2H_2$ or DCS of a predetermined ratio, which is deposited by conventional processes with the exception, of course, of the oscillatory deposition rate scheme proposed by the present invention. In an exemplary embodiment, the $NH_3$ and DCS is mixed in such a way to produce a hydrogen rich environment. However, in other embodiments, the mixture may be mixed to provide a silicon rich environment.

For example, in one embodiment, the predetermined ratio for the first (and, preferably, the third also) isolation stack-sublayers 16a, 16c, respectively, is about 6:1 (ammonia to dichlorosilane). In a related embodiment, the predetermined ratio for the second isolation stack-sublayer is about 3:1 (ammonia to dichlorosilane), and in yet another embodiment, the predetermined ratio of ammonia to dichlorosilane may be about 12:1. However, as indicated above, the predetermined ratios for these layers may be reversed. For example, the predetermined ratio for the isolation stack-sublayers 16a and 16c may be about 3:1 and the predetermined ratio for isolation stack-sublayer 16b may be about 6:1. The preferred deposition rate scheme, however, is the former of these examples. It will also, of course, be appreciated that the predetermined ratios may take on a variety of patterns and at a variety of rates, provided that the deposition of each layer is varied from the one previous to it.

Figure 2:
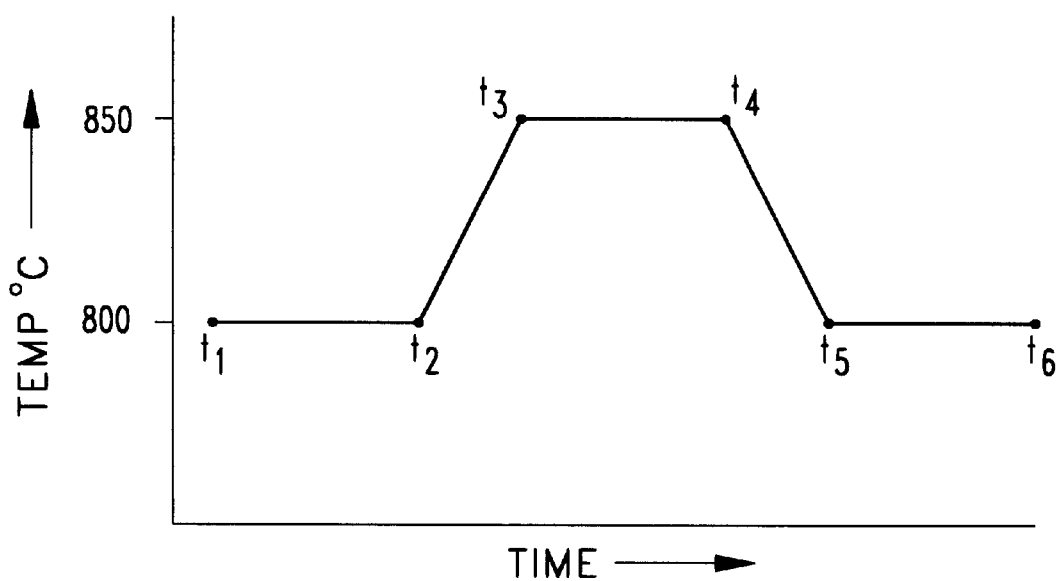
FIG. 2 illustrates a schematic graph of a flow rate history for an oxidation scheme in accordance with an advantageous embodiment of the present invention.

Turning now to FIG. 2, there is illustrated a schematic graph of the flow rate history for an oxidation scheme in accordance with an advantageous embodiment of the present invention. At $t_1$, the semiconductor wafer 10 is moved into the deposition chamber. An ammonia and dichlorosilane gas mixture is injected into the chamber at a rate of approximately 180 cc per minute for the ammonia and at a rate of approximately 30 cc per minute for the dichlorosilane, which provides a ratio of ammonia to dichlorosilane of about 6:1. The temperature and pressure are maintained at approximately 800° C. and about 50 milliTorr, respectively. The deposition rate of the silicon nitride may vary greatly. For example, the deposition rate may range from about 0.5 nm per minute to about be about 1 nm, which continues until $t_2$. The period of time that the deposition continues depends on the desired thickness of the first layer. Moreover, it should be understood that the temperatures and pressures at which deposition occurs may also vary, depending on the deposition equipment used and rate of deposition desired.

These deposition conditions form a first isolation stack-sublayer of silicon nitride having a thickness that varies, depending on the desired application. For example, in one embodiment of the present invention, the first stack-sublayer has a thickness that may range from about 1 nm to about 40 nm. In a more specific embodiment, the first stack-sublayer has a thickness of less than about 2 nm. In an even more specific embodiment, the first stack-sublayer has a thickness of about 1.5 nm.

At $t_2$, the temperature is increased from about 800° C. to about 850° C. and the pressure is increased to about 225 milliTorr until $t_3$. The rate at which the temperature is increase is inconsequential to the overall process. It may be increased rapidly or gradually. The ammonia and dichlorosilane gas mixture is injected into the chamber at a rate of about 180 cc per minute for the ammonia and at a rate of about 60 cc per minute for the dichlorosilane, which provides a preferred ratio of ammonia to dichlorosilane of about 3:1. Again, the deposition rate of the silicon nitride may vary greatly. For example, the deposition rate may be range from about 3 nm per minute to about 5 nm per minute. This deposition continues until $t_4$, which depends on the desired thickness of the second layer.

These deposition conditions form a second isolation stack-sublayer of silicon nitride having a thickness that varies, depending on the desired application. For example, in one embodiment, the second stack-sublayer has a thickness-that ranges from about 1 nm to about 40 nm. In a more specific embodiment, the second isolation stack-sublayer has a thickness of about 2.5 nm.

Then at $t_4$, the temperature is decreased to about 800° C. until $t_5$. Again, the rate at which the temperature is increase is inconsequential to the overall process. It may be increased rapidly or gradually. At $t_5$, the ammonia and dichlorosilane gas mixture is injected into the chamber at a rate of about 180 cc per minute for the ammonia and at a rate of about 30 cc per minute for the dichlorosilane, which provides a preferred ratio of ammonia to dichlorosilane of about 6:1. The temperature is maintained at about 800° C. and the pressure is reduced back to about 50 milliTorr. The deposition rate of the silicon nitride may vary greatly. For example, the deposition rate may range from about 0.5 nm per minute to about 1 nm per minute, which continues until $t_6$, at which time, the semiconductor wafer 10 is removed from the deposition chamber. The period of time that the deposition continues depends on the desired thickness of the first layer.

These deposition conditions form an optional third isolation stack-sublayer of silicon nitride having a thickness that varies, depending on the application. For example, the thickness of the third isolation stack-sublayer may range from about 1 nm to about 40 nm. As previously stated, the above-described process may be repeated for several cycles that are limited only by the overall thickness requirements of the semiconductor.

Figure 3:
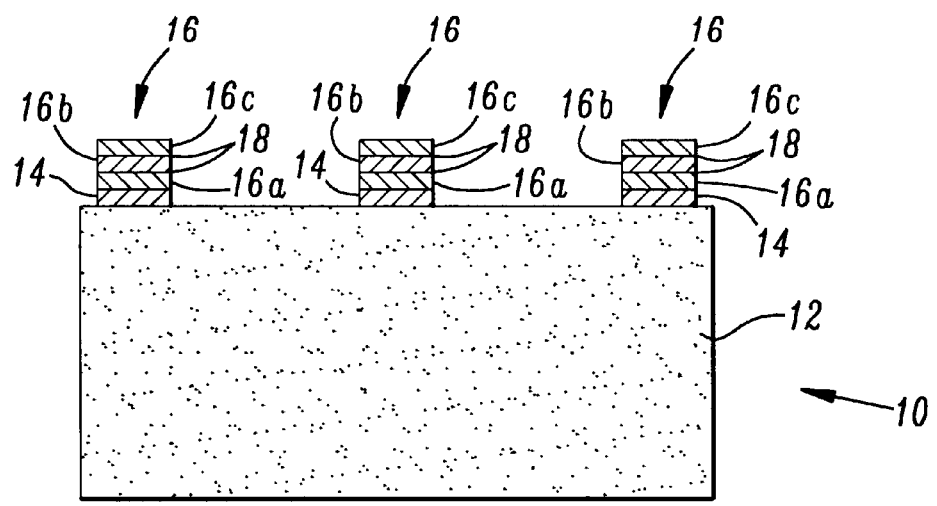
FIG. 3 illustrates a schematic representation of the exemplary structure of FIG. 1 wherein a portion of the nitride layer structure has been etched away.

Turning now to FIG. 3, there is illustrated an intermediate structure of the semiconductor wafer 10 manufactured in accordance with the present invention. In this figure, the isolation structure 16 has been masked and etched in accordance with conventional processes. The above-described process produces an isolation structure that is better able to absorb stress, has greater uniformity and is far less subject to the disadvantageous phenomenon of stack lifting, particularly encountered in semiconductors having a PADOX layer deposited thereon. The uniformity in thickness provides an isolation structure that, in preferred embodiments, has thickness variability of less than three percent. This excellent thickness variability allows the PADOX 14 to be much thinner than before since the thickness produced by the present process is extremely uniform across the semiconductor wafer 10. Furthermore, as previously discussed, the oscillatory fashion in which the isolation layers 16a, 16b and 16c are deposited provide a isolation structure 16 that has virtual interfaces 18 therebetween to accommodate and reduce the overall stress within the isolation structure 16.

Figure 4:
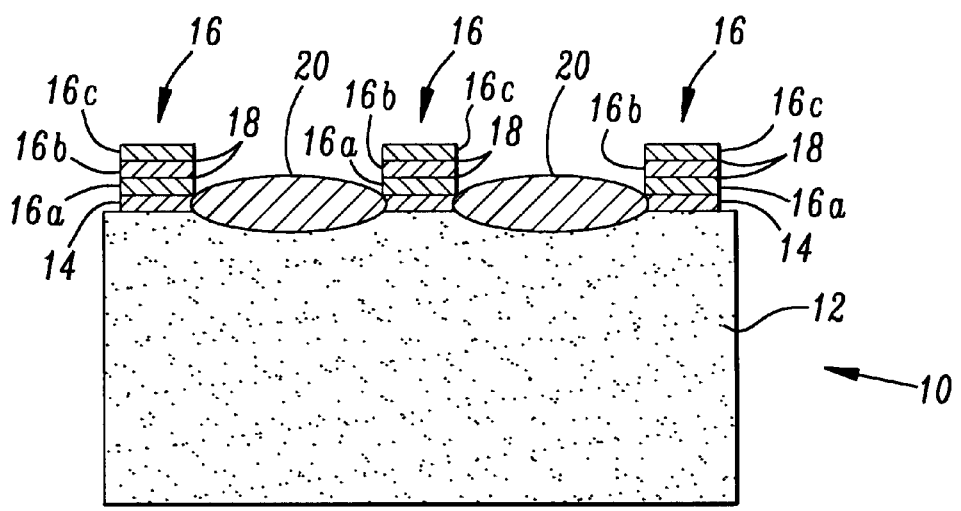
FIG. 4 illustrates a schematic representation of the exemplary structure of FIG. 3 wherein the field oxide has been grown following the etch away of a portion of the nitride layer structure.

Turning now to FIG. 4, there is illustrated the semiconductor wafer 10 of FIG. 3 wherein a field oxide 20 has been isolated and formed on the semiconductor wafer 10 and between the isolation structures 16. Due to the thinner field oxides that are now required by the present day technologies, e.g., from about 150 nm to about 250 nm, the field oxide 20 can be grown with conventional dry oxide process, which reduces the bird's-beak length and thereby reduces the stack-lifting. This reduced stack-lifting, in turn, also reduces the stress within the isolation structure 16. It is believed that a bird's-beak length of less than 50 nm can be achieved by way of the deposition method provided by the present invention with a field oxide thinning of less than 25 nm. The reduction in stress provides a isolation structure that etches more evenly. When this aspect is coupled with the uniform thickness of the isolation layer, the PADOX's thickness may also be reduced, thereby achieving a reduction in the overall thickness of the semiconductor device.

EXPERIMENTAL RESULTS:

Ten mechanical and over 30 device lots were processed in accordance with the present invention. The starting substrate was a p/p+ (100) and the silicon wafers were oxidized at 800° C. to 850° C. to form the buffer PADOX having a thickness ranging from about 5 nm to 20 nm. The PADOX was capped with a nitride layer having a thickness ranging from about 60 nm to about 120 nm and composed for three deposited stack-sublayers. The nitride layers were deposited by low pressure chemical vapor deposition (LPCVD) by a reaction of ammonia ($NH_3$) and dichlorosilane $SiH_2Cl_2$. The unique isolation structure of the present invention was obtained by a deliberate oscillation in the deposition rate of the various stack-sublayers (1 nm to 5 nm/minute) by fluctuating the $NH_3$:$SiH_2Cl_2$ ratio from about 6:1 to about 3:1 and the pressure from about 50 to about 250 milliTorr during the LPCVD reaction of $NH_3$ and $SiH_2Cl_2$ at about 750° C. to about 800° C., as discussed above. It is believed that this fluctuation in deposition rate causes microstructural sublayering. At least two stack-sublayers are needed for stress-accommodation and reduction. In addition, decreasing the ammonia:dichlorosilane ratio also makes the isolation structure silicon rich. It is further believed that the oscillatory fashion in which the pad silicon nitride isolation structure is formed produces an isolation structure that has thickness and stress unformity, which are important to the isolation integrity.

Forming the stack-sublayers as discussed herein achieved an isolation structure thickness variability from wafer to wafer of less than 2% with stress accommodation and stress reduction. Thus, there was better etch selectivity with no stack lifting, and a thinner PADOX of less than 6.5 nm was used without oxide punch through. For example, Pad oxides with thicknesses ranging from about 5 nm to about 15 nm and pad nitride (isolation structure) with thicknesses ranging from about 60 nm to about 120 nm for a dry field oxide with a thickness ranging from about 100 nm to about 250 nm were fabricated. The results are shown in the following tables:

| Birds Beak Length (Pad Oxide = 9 nm) | | | |
|---|---|---|---|
| FOX thickness | 150 nm | 200 nm | 250 nm |
| 117.5 nm $Si_3N_4$ | 25 nm | 40 nm | 50 nm |
| 240 nm $Si_3N_4$ | 25 nm | 40 nm | 50 nm |

| Birds Beak Length (FOX = 250 nm) | | | |
|---|---|---|---|
| Pad-Oxide Thickness | 9 nm | 15 nm | 20 nm |
| 117.5 nm $Si_3N_4$ | 50 nm | 65 nm | 80 nm |
| 240 nm $Si_3N_4$ | 50 nm | 65 nm | 70 nm |

| Birds Beak Length (FOX = 250 nm) | | | |
|---|---|---|---|
| $Si_3N_4$ Thickness | 117.5 nm | 180 nm | 240 nm |
| 9 nm Pad-Oxide | 50 nm | 50 nm | 50 nm |
| 20 nm Pad-Oxide | 89 nm | 80 nm | 80 nm |

For the foregoing tables the following is applicable:
Dry Oxidation 1100° C.
Scanning Electron Microscope (all) and Defect Etching (Extremes-sfs)
No Stack Lifting for 117.5 nm Nitride
Negligible FOX Thinning (30 nm for 30 NM PADOX thickness)

From the foregoing, it is readily apparent that the present invention provides a process and a semiconductor that has the advantages of: (1) reduced isolation structure thickness variability, (2)oscillatory layering that results in stress accommodation and reduction with a simultaneous reduction in pinholes and micro-cracks, (3) better etch selectivity of the isolation structure is expected due to stress accommodation, (4)PADOX thickness reduction to 5 nm and (5) reduction of stack-lifting due to stress accommodation.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

What is claimed is:

1. A semiconductor device manufactured by the method, comprising:
   forming a pad oxide layer over a semiconductor substrate to a thickness ranging from about 5 nm to about 25 nm;
   depositing a first stack-sublayer over the pad oxide layer at a deposition rate that ranges from about 0.5 nm per minute to about 1 nm per minute and in a zone of low pressure and at a temperature of about 800° C.;
   subsequently depositing a second stack-sublayer over said first stack-sublayer at a deposition rate that ranges from about 3 nm per minute to about 5 nm per minute in said zone of low pressure and at said temperature, said first and second stack-sublayers forming an isolation structure; and
   forming an oxide structure adjacent the isolation structure wherein the oxide structure has a bird's-beak length of less than 50 nm.

2. The semiconductor as recited in claim 1 wherein said method further comprises the step of:
   depositing a third stack-sublayer over said second stack-sublayer at a deposition rate that ranges from about 0.5 nm per minute to about 1 nm per minute.

3. The semiconductor as recited in claim 2 wherein said third stack- sublayer has a thickness that ranges from about 1 nm to about 40 nm.

4. The semiconductor as recited in claim 2 wherein said first, second, and third stack-sublayers are each silicon nitride composed of a mixture of $NH_3$ and $SiCl_2H_2$.

5. The semiconductor as recited in claim 4 wherein said mixture has a ratio of NH3 to $SiCl_2H_2$ for said first and third stack-sublayers of about 6:1.

6. The semiconductor as recited in claim 4 wherein said mixture has a ratio of NH3 to $SiCl_2H_2$ for said second stack-sublayer of about 3:1.

7. The semiconductor as recited in claim 1 wherein said first stack-sublayer has a thickness that ranges from about 1 nm to about 40 nm.

8. The semiconductor as recited in claim 1 wherein said second stack-sublayer has a thickness that ranges from about 1 nm to about 40 nm.

9. The semiconductor as recited in claim 1 wherein said step of elevating comprises the steps of:
   elevating said temperature to at least 750° C. for said steps of depositing said first stack-sublayer and subsequently depositing said third stack-sublayer; and
   elevating said temperature to at least 800° C. for said step of subsequently depositing said second stack-sublayer.

10. The semiconductor as recited in claim 1 wherein said step of creating comprises the steps of:
    creating a zone of at most 100 milliTorr for said steps of depositing said first stack-sublayer and subsequently depositing said third stack-sublayer; and
    creating a zone of at most 250 milliTorr for said step of subsequently depositing said second stack-sublayer.

11. The semiconductor as recited in claim 1 wherein a deviation of a uniform thickness of said first and second stack-sublayers is less than 10%.

12. An intermediate semiconductor structure comprising:
    a pad oxide layer having a thickness ranging from about 5 nm to about 25 nm;
    an isolation structure including first and second stack-sublayers located over the pad oxide; and
    an oxide structure located adjacent said isolation structure and having a bird's-beak length of less than 50 nm.

13. The intermediate semiconductor structure as recited in claim 12 wherein said isolation structure further comprises a third stack-sublayer deposited over said second stack-sublayer at a third deposition rate that is substantially equal to said first deposition rate.

14. The intermediate semiconductor structure as recited in claim 13 wherein said first and third stack-sublayers have a thickness that ranges from about 1 nm to about 40 nm.

15. The intermediate semiconductor structure recited in claim 12 wherein said first nitride sublayer has a thickness that ranges from about 1 nm to about 40 nm.

16. The intermediate semiconductor structure recited in claim 12 wherein said second stack-sublayer has a thickness that ranges from about 1 nm to about 40 nm.

17. The intermediate semiconductor structure recited in claim 12 wherein said first and second stack-sublayers are each silicon nitride composed of a mixture of $NH_3$ and $SiCl_2H_2$.

18. The intermediate semiconductor structure recited in claim 17 wherein said mixture has a ratio of $NH_3$ to $SiCl_2$, $H_2$ for said first stack-sublayer of about 6:1.

19. The intermediate semiconductor structure as recited in claim 17 wherein said mixture has a ratio of $NH_3$ to $SiCl_2H_2$ for said second stack-sublayer of about 3:1.

20. The intermediate semiconductor structure as recited in claim 12 wherein said first and second stack-sublayers are deposited at a temperature of at least 800° C.

21. The intermediate semiconductor structure recited in claim 12 wherein said first and second stack-sublayers are deposited at a pressure of at most 250 milliTorr.

22. The intermediate semiconductor as recited in claim 12 wherein a combined thickness of said first and second stack-sublayers have a thickness deviation of less than 3%.

23. The intermediate semiconductor structure as recited in claim 12 wherein a deviation of a uniform thickness of said first and second stack-sublayers is less than 10%.

* * * * *